United States Patent [19]

Ueda et al.

[11] Patent Number: 5,046,180
[45] Date of Patent: Sep. 3, 1991

[54] SEMICONDUCTOR INTEGRATED CIRCUIT DEVICE COMPRISING NON-REPROGRAMMABLE INTERNAL MEMORY DEVICE

[75] Inventors: Osamu Ueda; Kikuo Muramatsu, both of Hyogo, Japan

[73] Assignee: Mitsubishi Denki Kabushiki Kaisha, Tokyo, Japan

[21] Appl. No.: 351,223

[22] Filed: May 15, 1989

[30] Foreign Application Priority Data

May 23, 1988 [JP] Japan ................. 63-126133

[51] Int. Cl.$^5$ .......................... G11C 8/00; G06F 12/00
[52] U.S. Cl. .............................. 365/189.03; 364/200; 364/243
[58] Field of Search ........... 365/189.03, 230.03, 365/200, 201; 364/200 MS File

[56] References Cited

U.S. PATENT DOCUMENTS

| | | | |
|---|---|---|---|
| 4,141,068 | 2/1979 | Mager et al. | 364/200 |
| 4,368,515 | 1/1983 | Nielsen | 364/200 |
| 4,400,798 | 8/1983 | Francis et al. | 365/230.03 |
| 4,542,453 | 9/1985 | Patrick et al. | 364/200 |
| 4,603,399 | 7/1986 | Cheek et al. | 364/900 |
| 4,610,000 | 9/1986 | Lee | 364/200 X |
| 4,802,119 | 1/1989 | Heene et al. | 364/900 |

OTHER PUBLICATIONS

Intel, *Microprocessor and Peripheral Handbook*, 1987, pp. 5-1 to 5-9.
Motorola, *Single-Chip Microcomputer Data Book, (DL 132R1), 1984*, pp. 3-746 to 3-761.
Intel, *Embedded Controller Handbook*, (1987), pp. 1-1 to 2-10.

*Primary Examiner*—Stuart N. Hecker
*Assistant Examiner*—Michael A. Whitefield
*Attorney, Agent, or Firm*—Lowe, Price, Leblanc and Becker

[57] ABSTRACT

A multifunctional memory comprises a mask ROM (2). When an "L" level signal is applied to a control pin (EXT), data is read out from the ROM (2) in response to an address signal inputted from a multiplex pin (AD/DA). Thereafter, the data read out from the ROM (2) is outputted from the multiplex pin (AD/DA). In this case, an "H" level signal is outputted from a chip select pin ($\overline{CS}$). When an "H" level signal is applied to the control pin (EXT), an "L" level signal is outputted from the chip select pin ($\overline{CE}$). Consequently, the EPROM (30) is rendered active. In addition, the address signal inputted from the multiplex pin (AD/DA) is outputted from a port/address pin (PORT/AD). Data is read out from the EPROM (30) in response to the address signal.

25 Claims, 3 Drawing Sheets

FIG.3

|   | EXT | RD | AD/DA | PORT/AD | $\overline{CS}$ |
|---|-----|----|----|----|----|
| (1) | L | L | ADDRESS SIGNAL INPUT (SELECTION OF RAM, ROM) | | H (EPROM INACTIVE) |
|   | L | H | DATA OUTPUT | | |
| (2) | H | L | ADDRESS SIGNAL INPUT (SELECTION OF RAM) | | H (EPROM INACTIVE) |
|   | H | H | DATA OUTPUT | | |
| (3) | H | L | ADDRESS SIGNAL INPUT (SELECTION OF ROM) | ADDRESS SIGNAL OUTPUT (SELECTION OF EPROM) | L (EPROM ACTIVE) |
|   | H | H | ADDRESS SIGNAL INPUT | | |

SEMICONDUCTOR INTEGRATED CIRCUIT DEVICE COMPRISING NON-REPROGRAMMABLE INTERNAL MEMORY DEVICE

BACKGROUND OF THE INVENTION

1. Field of the Invention

The present invention relates generally to semiconductor integrated circuit device, and more particularly, to a multifunctional semiconductor integrated circuit device comprising a non-reprogrammable internal memory device.

2. Description of the Background Art

FIG. 4 is a connection diagram in the trial manufacture and evaluation of a system comprising a conventional IC memory and a CPU (Central Processing Unit).

In FIG. 4, an IC memory 10 comprises a ROM (Read Only Memory) in which the pattern of stored data cannot be changed. At the time of trial manufacture and evaluation of a system comprising such an IC memory 10 and a CPU 20, operation tests of the IC memory 10 and the CPU 20 must be performed while changing the pattern of data stored in the ROM. Therefore, in many cases, evaluation is performed with an EPROM (Erasable Programmable Read Only Memory) 30 in which the pattern of stored data can be changed being externally connected to the ROM portion.

In FIG. 4, the IC memory 10 comprises a ROM in which the pattern of stored data cannot be changed, such as a mask ROM and an OTPROM (One Time Programmable Read Only Memory) formed by sealing in a plastic package an EPROM chip capable of erasure by ultraviolet rays. A multiplex pin AD/DA of the CPU 20 is used for outputting an address signal and inputting data. The address signal outputted from the multiplex pin AD/DA is applied to a latch circuit 40. This address signal is stationarily applied to respective address pins AD of the IC memory 10 and the EPROM 30 in response to a timing signal from an address latch enable pin ALE of the CPU 20. Respective data pins DA of the IC memory 10 and the EPROM 30 are directly connected to the multiplex pin AD/DA of the CPU 20. An output of a decoder circuit 50 is applied to respective chip enable pins $\overline{CE}$ of the IC memory 10 and the EPROM 30.

Each of the IC memory 10 and the EPROM 30 is rendered active only when a signal applied to the chip enable pin $\overline{CE}$ thereof is at the "L" level. Thus, when the externally connected EPROM 30 is used, "L" and "H" level signals are respectively applied to the chip enable pins $\overline{CE}$ of the EPROM 30 and the IC memory 10 by the decoder circuit 50. Consequently, an output of the data pin DA of the IC memory 10 becomes the floating level, not to conflict with data from the data pin DA of the EPROM 30.

Meanwhile, the connection diagram of FIG. 4 is typically drawn. In practice, there exist a plurality of multiplex pins AD/DA, and a control signal outputted from the CPU 20 becomes more complicated depending on the system.

As described in the foregoing, in a ROM in which the pattern of stored data cannot be changed and a conventional IC memory comprising such a ROM, additional circuits such as a decoder circuit and a latch circuit are required in using an externally connected EPROM for trial manufacture and evaluation.

SUMMARY OF THE INVENTION

An object of the present invention is to provide a semiconductor integrated circuit device comprising a non-reprogrammable internal memory device, in which an external memory device can be used in place of the internal memory device without requiring additional circuits.

Another object of the present invention is to provide a multifunctional semiconductor integrated circuit device comprising a non-reprogrammable internal memory device, in which a programmable external memory device can be used in place of the internal memory device without using additional circuits.

Still another object of the present invention is to make it possible to use, in a semiconductor integrated circuit device comprising a ROM and a RAM, an externally connected EPROM in place of the ROM without additional circuits.

A further object of the present invention is to provide an operating method by which an external memory device can be used without using additional circuits, in a semiconductor integrated circuit device comprising a non-reprogrammable internal memory device.

The present invention is directed to a semiconductor integrated circuit device comprising non-reprogrammable internal memory means, in which programmable external memory means can be used in place of the internal memory means, which comprises an input terminal, an output terminal, and control means. A control signal is applied to the input terminal. The control means is responsive to the control signal applied to the input terminal for outputting from the output terminal a signal for bringing the internal memory means to the operating state and bringing the external memory means to the non-operating state or a signal for bringing the internal memory means to the non-operating state and bringing the external memory means to the operating state.

In the semiconductor integrated circuit device according to the present invention, the external memory means can be used in place of the internal memory means by only connecting the external memory means without additional circuits in the trial manufacture and evaluation. Selection can be made in response to the control signal applied to the input terminal such that the internal memory means and the external memory means are respectively brought to the operating state and the non-operating state or the internal memory means and the external memory means are respectively brought to the non-operating state and the operating state.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a diagram for explaining an operation of the multifunctional memory shown in FIG. 1.

DESCRIPTION OF THE PREFERRED EMBODIMENTS

Figure 1:
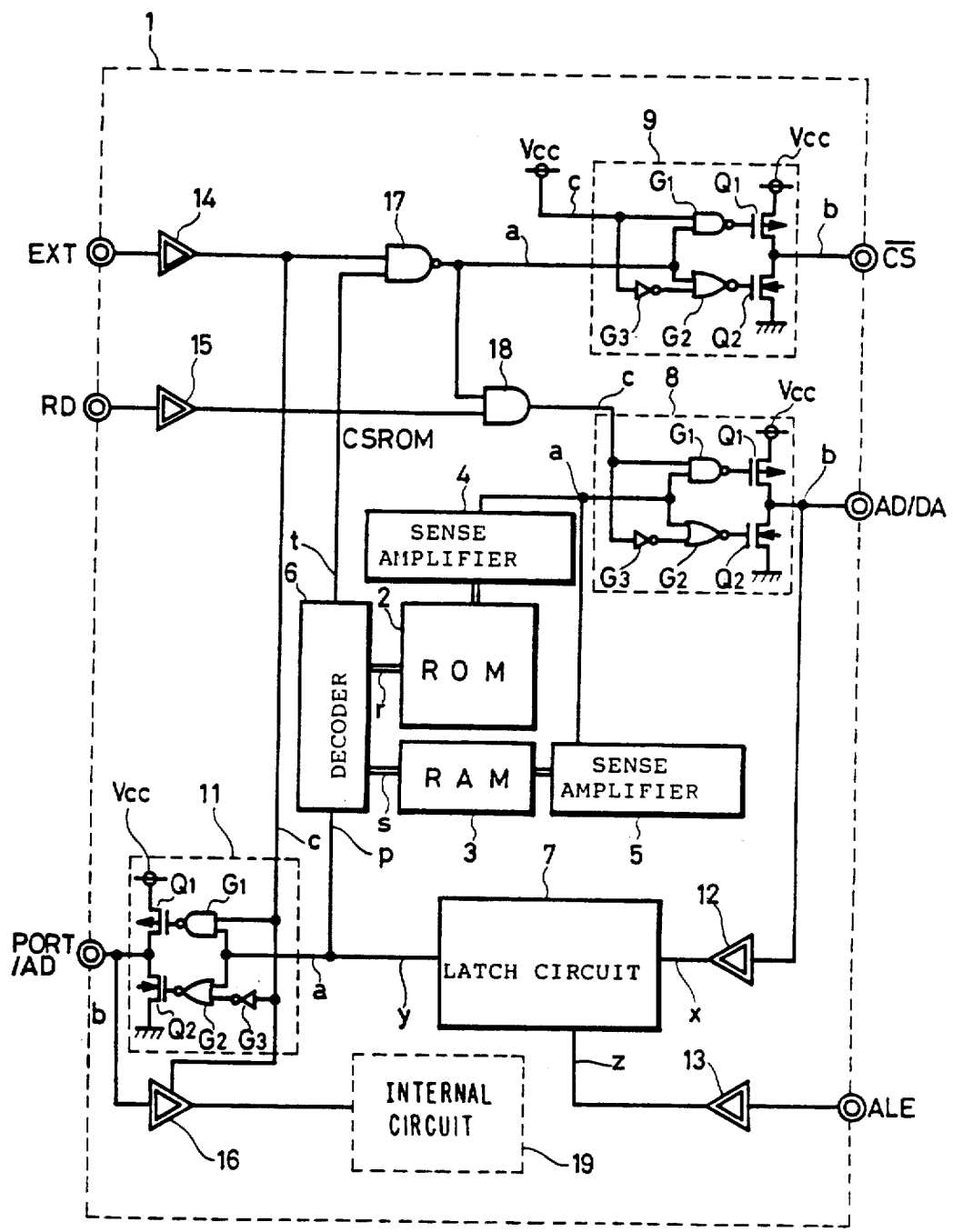
FIG. 1 is a schematic circuit diagram showing a main part of a multifunctional memory according to an embodiment of the present invention.

Referring now to the drawings, an embodiment of the present invention will be described.

FIG. 1 is a schematic circuit diagram showing a multifunctional memory according to an embodiment of the present invention.

This multifunctional memory is mainly a memory in which a mask ROM, a RAM (Random Access Memory) and an input port are formed on one chip. In FIG. 1, the multifunctional memory 1 comprises a mask ROM 2, a RAM 3, sense amplifiers 4 and 5, a decoder 6, a latch circuit 7, output buffers 8, 9 and 11, input buffers 12 to 16, a NAND circuit 17, and an AND circuit 18. A multiplex pin AD/DA for an address signal and data as multiplexed is connected to an input terminal x of the latch circuit 7 through the input buffer 12. An address latch enable pin ALE is connected to a latch terminal z of the latch circuit 7 through the input buffer 13. An output terminal y of the latch circuit 7 is connected to an input terminal a of the output buffer 11, and to an input terminal p of the decoder 6. An output terminal b of the output buffer 11 is connected to a port/address pin PORT/AD. This port/address pin PORT/AD is connected to an internal circuit 19 through the input buffer 16.

An output terminal r of the decoder 6 is connected to the ROM 2 and an output terminal s thereof is connected to the RAM 3. The ROM 2 is connected to an input terminal a of the output buffer 8 through the sense amplifier 4. The RAM 3 is also connected to the input terminal a of the output buffer 8 through the sense amplifier 5. An output terminal B of the output buffer 8 is connected to the multiplex pin AD/DA.

On the other hand, an external ROM control pin (referred to as control pin hereinafter) EXT is connected to one input terminal of the NAND circuit 17 and a control terminal c of the output buffer 11 through the input buffer 14. The NAND circuit 17 has another input terminal connected to an output terminal t of the decoder 6. A CSROM signal is outputted from the output terminal t of the decoder 6. The NAND circuit 17 has its output terminal connected to an input terminal a of the output buffer 9 and one input terminal of the AND circuit 18. The AND circuit 18 has another input terminal connected to a read pin RD through the input buffer 15. The AND circuit 18 has its output terminal connected to a control terminal c of the output buffer 8. A power-supply potential Vcc is applied to a control terminal c of the output buffer 9. An output terminal b of the output buffer 9 is connected to a chip select pin $\overline{CS}$.

Each of the output buffers 8, 9 and 11 comprises a P channel MOS transistor Q1, an N channel MOS transistor Q2, a NAND circuit G1, a NOR circuit G2 and an inverter G3. In each of the output buffers 8, 9 and 11, a signal applied to the input terminal a is outputted from the output terminal b when an "H" level signal is applied to the control terminal c, while the output terminal b is rendered electrically floating when an "L" level signal is applied to the control terminal c.

An address signal applied to the multiplex pin AD/DA is applied to the latch circuit 7 through the input buffer 12. The latch circuit 7 is responsive to a timing signal applied from the address latch enable pin ALE through the input buffer 13 for latching the address signal to apply the same to the decoder 6. The decoder 6 is responsive to the address signal for selectively bringing the ROM 2, the RAM 3 or the internal circuit 19 to the operating state.

On the other hand, when an "L" level signal is applied to the control pin EXT, an output of the output buffer 11 becomes the floating level and an output of the NAND circuit 17 becomes the "H" level. On this occasion, when an "H" level signal is applied to the read pin RD, the output buffer 8 outputs to the multiplex pin AD/DA the signal applied to the input terminal a. On this occasion, an "H" level signal is outputted from the chip select pin $\overline{CS}$. In this case, the internal ROM 2, RAM 3 or internal circuit 19 is operated. For example, if the ROM 2 is selected in response to an address signal, information of a selected memory bit in the ROM 2 is output through the multiplex pin AD/DA through the sense amplifier 4 and the output buffer 8.

Description is now made on a case in which an "H" level signal is applied to the control pin EXT. The decoder 6 outputs an "H" level CSROM signal from the output terminal t when an address signal is a signal for selecting the ROM 2. Consequently, an output of the NAND circuit 17 becomes the "L" level. Therefore, an "L" level signal is outputted from the chip select pin $\overline{CS}$. Furthermore, in this state, even if an "H" level signal is applied to the read pin RD, an output of the AND circuit 18 becomes the "L" level, so that an output of the output buffer 8 becomes the floating level. On the other hand, on this occasion, since an "H" level signal is applied to the control terminal c of the output buffer 11, the output buffer 11 always outputs the address signal latched in the latch circuit 7 from the port-/address pin PORT/AD.

Meanwhile, this embodiment shows a case in which a single pin is shared between the input port and the address output.

Figure 2:
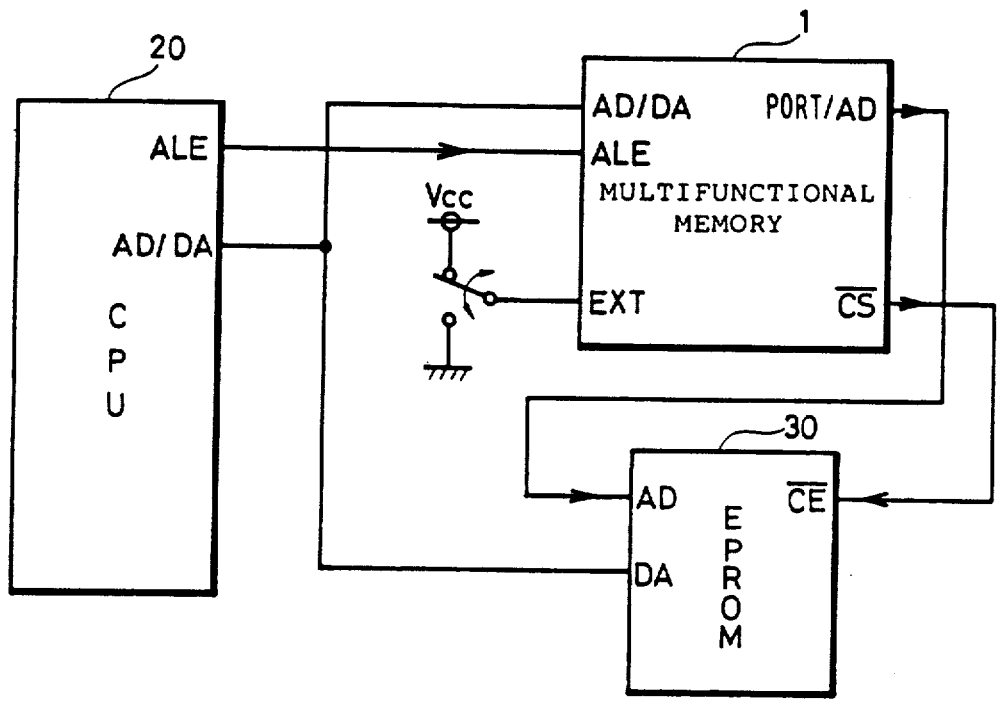
FIG. 2 is a connection diagram of the multifunctional memory shown in FIG. 1, an external EPROM and a CPU.
Figure 4:
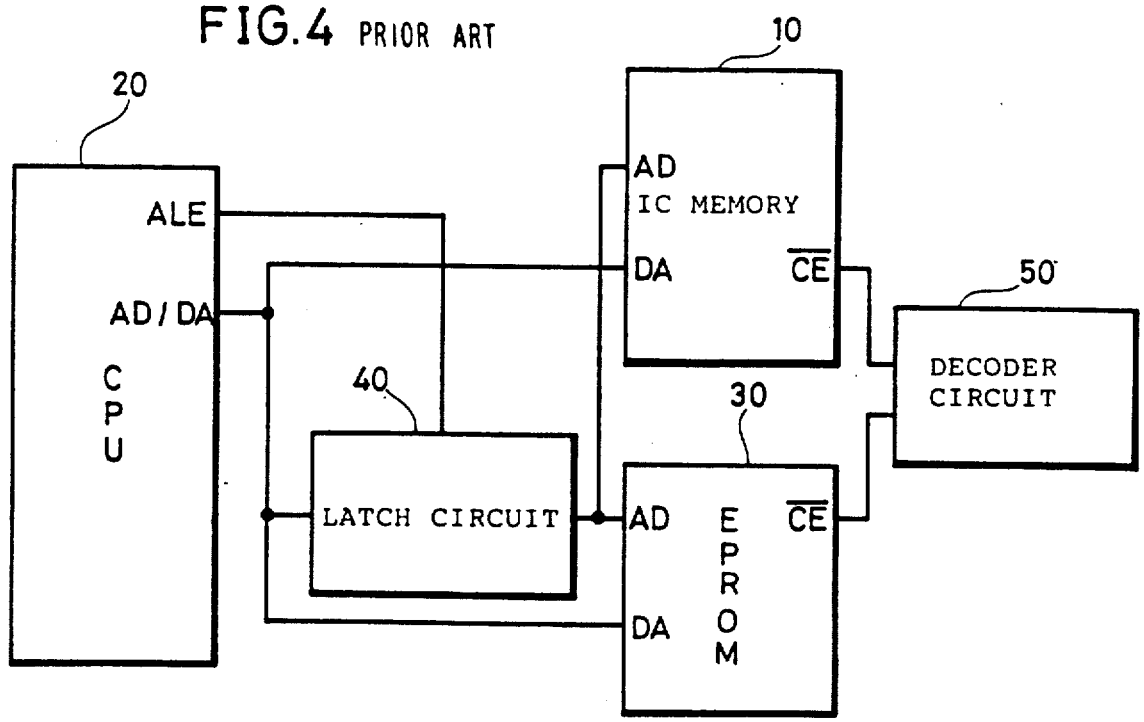
FIG. 4 is a connection diagram of a conventional IC memory, an external EPROM and a CPU.

FIG. 2 is a connection diagram showing a case in which the mask ROM of the multifunctional memory 1 according to the present embodiment is replaced with an external EPROM. In FIG. 2, an address latch enable pin ALE of a CPU 20 is connected to an address latch enable pin ALE of a multifunctional memory 1. A multiplex pin AD/DA of the CPU 20 is connected to a multiplex pin AD/DA of the multifunctional memory 1 and a data pin DA of an EPROM 30. An address pin PORT/AD in the multifunctional memory 1 is connected to an address pin PORT/AD of the EPROM 30. Meanwhile, the address pin PORT/AD of the multifunctional memory 1 corresponds to the port/address pin PORT/AD shown in FIG. 1. A chip select pin $\overline{CS}$ of the multifunctional memory 1 is connected to a chip enable pin $\overline{CE}$ of the EPROM 30. Switching is performed such that a control pin EXT of the multifunctional memory 1 receives an "H" level (Vcc level) signal or an "L" level (ground level) signal.

Description is now made in an operation of the system shown in FIG. 2. First, when an "L" level signal is applied to the control pin EXT, access is made to the mask ROM 2 and the RAM 3 contained in the multifunctional memory 1, resulting in a state in which the external EPROM 30 is not used. More specifically, data stored in the mask ROM 2 and the RAM 3 in the multifunctional memory 1 are read out in response to an address signal applied to the multiplex pin AD/DA of the multifunctional memory 1 from the multiplex pin AD/DA of the CPU 20, so that the data are applied to the multiplex pin AD/DA of the CPU 20 from the multiplex pin AD/DA of the multifunctional memory 1.

When an "H" level signal is applied to the control pin EXT, access to the mask ROM 2 of the multifunctional memory 1 is not made while access to the EPROM 30 is made. In this case, as seen from the side of the CPU 20, access is made to the external EPROM 30 in place of the mask ROM 2 by selecting all the same address and setting all the same timings as those in a case in which access is made to the mask ROM 2 of the multifunctional memory 1. More specifically, if and when an address signal applied to the multiplex pin AD/DA of the multifunctional memory 1 from the multiplex pin AD/DA of the CPU 20 is a signal for selecting the mask ROM 2, the address signal is applied to the address pin AD of the EPROM 30 from the address pin PORT/AD of the multifunctional memory 1. In addition, an "L" level signal is outputted from the chip select pin $\overline{CS}$ of the multifunctional memory 1, to be applied to the chip select pin $\overline{CS}$ of the EPROM 3. Consequently, the EPROM 30 enters the operating state, so that data stored in the EPROM 30 is applied from the data pin DA therein to the multiplex pin AD/DA of the CPU 20 in response to the address signal.

A summary of the operation of the multifunctional memory shown in FIG. 1 is shown in FIG. 3.

(1) An operation to occur when an "L" level signal is applied to the control pin EXT is as follows: when an "L" level signal is applied to the read pin RD, the multiplex pin AD/DA enters a state in which an externally applied address signal can be inputted. Data is read out from the ROM 2 or the RAM 3 in response to the inputted address signal. In this case, an "H" level signal is outputted from the chip select pin $\overline{CS}$. Consequently, the EPROM 30 is rendered inactive. When an "H" level signal is applied to the read pin RD, the multiplex pin AD/DA enters a state in which data can be outputted. Consequently, the data read out from the ROM 2 or the RAM 3 is outputted from the multiplex pin AD/DA.

(2) An operation to occur when an "H" level signal is applied to the control pin EXT and the RAM 3 is selected in response to an address signal is as follows: when an "L" level signal is applied to the read pin RD, the multiplex pin AD/DA enters the input state of an address signal. It is assumed that the RAM 3 is selected in response to the address signal inputted from the multiplex pin AD/DA. In this case, an "H" level signal is outputted from the chip select pin $\overline{CS}$. When an "H" level signal is applied to the read pin RD, the multiplex pin AD/DA enters the data output state. Consequently, data read out from the RAM 3 is outputted from the multiplex pin AD/DA.

(3) An operation to occur when an "H" level signal is applied to the control pin EXT and the ROM 2 is selected in response to an address signal is as follows: when an "L" level signal is applied to the read pin RD, the multiplex pin AD/DA enters the input state of an address signal. It is assumed that the ROM 2 is selected in response to the address signal inputted from the multiplex pin AD/DA. In this case, an "L" level signal is outputted from the chip select pin $\overline{CS}$. Consequently, the EPROM 30 is rendered active. In addition, the port/address pin PORT/AD enters the output state. When an "H" level signal is applied to the read pin RD, the multiplex pin AD/DA is maintained in the input state of an address signal. Consequently, the address signal applied to the multiplex pin AD/DA is transferred to the port/address pin PORT/AD, to be outputted therefrom. The address signal outputted from the port/address pin PORT/AD is applied to the EPROM 30.

In the above described manner, data is read out from the EPROM 30, not from the ROM 2.

As described in the foregoing, the multifunctional memory according to the present embodiment requires a complicated additional circuit in using the external EPROM, which is very favorable in, for example, frequently changing a ROM pattern in the trial manufacture and evaluation, or the like.

Meanwhile, in the embodiment shown in FIGS. 1 and 2, a mask ROM is used as non-reprogrammable storing means, an OTPROM may be used as non-reprogrammable storing means. In this case, it is necessary to apply all the same circuit system, to obtain the same effect.

Although in FIGS. 1 and 2, only a single multiplex pin AD/DA is shown in order to simplify the description, a plurality of multiplex pins AD/DA actually exist. In addition, the circuit system shown in FIG. 1 is a basic circuit system. It should be noted that the present invention is not limited to this circuit system. For example, various circuits may be used, to obtain the same effect.

Post Disclosure Summary

As described in the foregoing, according to the present invention, programmable external memory means can be simply used without requiring complicated additional circuits in place of non-reprogrammable internal memory means in the trial manufacture and evaluation, or the like. This will not induce a difference in timings caused by an additional circuit system when an additional circuit is required and a malfunction caused by an interconnection or the like. In addition, not only at the time of trial manufacture and evaluation but also when a failure occurs in, for example, a market, it can be easily examined by using the programmable external memory means whether or not a failure occurs in a part of non-reprogrammable internal memory means. Furthermore, when a failure occurred in the internal memory means, failure measures can be easily taken without replacing the semiconductor integrated circuit device by always using the external memory means.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising non-reprogrammable internal memory means, in which programmable external memory means can be used in place of the non-reprogrammable internal memory means, comprising:
 a first input terminal receiving a first control signal having a first state and a second state;
 a second input terminal receiving a signal indicating an address;
 a first output terminal; and
 control means, responsive to said first control signal applied to said first input terminal; wherein
  when said first control signal is in said first state, said control means brings said non-reprogrammable internal memory means to an operating state, applies said address to said non-reprogrammable internal memory means, and applies to said first output terminal a select signal of a first state to bring said external memory means to a non-operating state, and when said first control signal is in said second state said control means brings said non-reprogrammable internal memory means to the non-operating state and applies to said first output terminal a select signal of a second state to bring said external memory means to an operating state, and passes said address to said external memory means.

2. The semiconductor integrated circuit device according to claim 1, which further comprises a third input terminal receiving a second control signal having a first state and a second state; and a second output terminal; wherein said second input terminal is an input/output terminal for inputting the signal indicating an address and for outputting data;

said control means applies to said non-reprogrammable internal memory the signal indicating an address applied to said input/output terminal in response to said first state of said first control signal and said first state of said second control signal;

said control means applies to said input/output terminal data read out from said non-reprogrammable internal memory in response to said first state of said first control signal and said second state of said second control signal, and said control means applies to said second output terminal the signal indicating an address applied to said input/output terminal, in response to said second state of said first control signal.

3. The semiconductor integrated circuit device according to claim 2, which further comprises programmable memory means, said control means applying said select signal of a first state to said first output terminal in response to said second state of said first control signal when said programmable memory means is selected in response to the address signal applied to said input/output terminal.

4. The semiconductor integrated circuit device according to claim 3, which further comprises selecting means responsive to said address signal for selecting either one of said non-reprogrammable internal memory means and said programmable memory means, said selecting means outputting a predetermined selection signal when said non-reprogrammable internal memory means is selected, said control means applying said select signal of the second state to said first output terminal in response to said second state of said first control signal and said predetermined selection signal.

5. The semiconductor integrated circuit device according to claim 4, wherein said control means comprises first logic processing means receiving said first control signal from said first input terminal and said predetermined selection signal from said selecting means for applying said select signal of the second state to said first output terminal in response to said second state of said first control signal and said predetermined selection signal and otherwise applying said select signal of the second state to said first output terminal, second logic means receiving said first or second select signals from said first logic processing means and said second control signal from said third input terminal for outputting a first logic signal in response to said first select signal and said second state of said second control signal and otherwise outputting a second logic signal, first buffer means connected between outputs of said non-reprogrammable internal memory means and said programmable memory means and said input/output terminal, which is rendered conductive in response to said first logic signal from said first logic processing means while being rendered non-conductive in response to said second logic signal therefrom, holding means responsive to an externally applied predetermined timing signal for holding the address signal applied to said input/output terminal, and second buffer means connected between said holding means and said second output terminal, which is rendered non-conductive in response to said first state of said first control signal from said first input terminal while being rendered non-conductive in response to said second state of said first control signal from said first input terminal.

6. The semiconductor integrated circuit device according to claim 2, wherein said control means comprises logic processing means receiving said first control signal from said first input terminal and said second control signal from said third input terminal for outputting a first logic signal in response to said first state of said first control signal and said second state of said second control signal and for otherwise outputting a second logic signal;

first buffer means connected between said non-reprogrammable internal memory means and said input/output terminal, which is rendered conductive in response to said first logic signal from said logic processing means while being rendered non-conductive in response to said second logic signal;

holding means responsive to an externally applied predetermined timing signal for holding the address signal applied to said input/output terminal; and second buffer means connected between said holding means and said second output terminal, which is rendered non-conductive in response to said first state of said first control signal from said first input terminal while being rendered conductive in response to said second state of said first control signal from said first input terminal.

7. The semiconductor integrated circuit device according to claim 6, which further comprises a fourth input terminal receiving a holding signal to be applied to said holding means.

8. The semiconductor integrated circuit device according to claim 3, wherein said programmable memory means comprises a RAM.

9. The semiconductor integrated circuit device according to claim 4, wherein said selecting means comprises a decoder.

10. The semiconductor integrated circuit device according to claim 1, wherein said internal memory means comprises a ROM.

11. The semiconductor integrated circuit device according to claim 1, wherein said external memory means comprises a programmable memory.

12. A method for selectively retrieving data from a first memory device comprising internal memory means and a second memory device, the method comprising the steps of:
   applying a control signal to the first memory device;
   applying a signal indicating an address of said internal memory means to the first memory device;
   if the control signal indicates a first state, using said address to retrieve data stored in said internal memory means, and controlling the first memory device such that it disables the second memory device; and
   if the control signal indicates a second state, controlling the first memory device such that the first memory device brings the second memory device to its operating state, and passes said address to said second memory device.

13. A method for selectively retrieving data from a first memory device and a second memory device as in claim 12 further comprising the steps of selectively retrieving data from both memory devices and using retrieved data from both devices to evaluate the first memory device.

14. A method for selectively retrieving data from a first memory device comprising internal memory means and a second memory device, the method comprising the steps of:
   applying a control signal and a signal indicating an address of said internal memory means to the first memory device;
   changing said control signal between a first and a second state;
   when said control signal is in said first state, using said address to retrieve data stored in said internal memory means, and controlling the first memory device such that it disables the second memory device; and
   when said control signal is in said second state, controlling the first memory device such that the first memory device brings the second memory device to its operating state, and passes said address to said second memory device.

15. A method for selectively retrieving data from a first memory device and a second memory device as in claim 14 further comprising the steps of selectively retrieving data from both memory devices and using retrieved data from both devices to evaluate the first memory device.

16. A semiconductor integrated circuit system, comprising:
   a first integrated circuit including first and second memories, an input control terminal, an input address terminal for receiving a memory address signal, and control circuitry; and
   a second integrated circuit including a third memory operative selectively in active or inactive operating states;
   said control circuitry including means responsive to:
   (1) a first state of a control signal applied to said input control terminal for accessing said first and second memories, selectively, depending on said memory address signal, while maintaining said third memory in the inactive operating state, and
   (2) a second state of the control signal applied to said input control terminal for accessing said first memory while maintaining said third memory in the inactive operating state when said first memory is addressed by said memory address signal and for accessing said third memory while maintaining said third memory in the active operating state when said second memory is addressed by said memory address signal.

17. A semiconductor integrated circuit system as in claim 16, wherein said first memory comprises a random access memory and second memory comprises a read only memory.

18. A semiconductor integrated circuit system as in claim 17, wherein said third memory comprises an electrically programmable read only memory.

19. A semiconductor integrated circuit system, comprising:
   an external memory means having a control input terminal and being controllable to be in an active condition when a first control signal having a first signal state is applied to said control input terminal and an inactive condition when the first control signal having a second signal state is applied to said control input terminal; and
   an integrated circuit including
   (a) first and second internal memory means;
   (b) a first input terminal receiving second control signal having first or second signal states,
   (c) a second input terminal for receiving an address signal;
   (d) a first output terminal connected to said control input terminal of said external memory means, and
   (e) control means, responsive to said second control signal, for operating selectively said first and second internal memory means and said external memory means, said control means including means operative when said second control signal is in the first signal state for accessing one of said first and second internal memory means, whichever is addressed by said address signal received by said second input terminal, and for supplying to said first output terminal the first control signal having the second signal state to maintain said external memory means in an inactive operating condition, and operative when said second control signal in is the second signal state for
   (1) supplying to said first output terminal the first control signal having the second signal state to maintain said external memory means in the inactive operating condition when said first internal memory means is addressed by said address signal received by said second input terminal, and
   (2) supplying to said first output terminal the first control signal having the first signal state to maintain said external memory means in the active operating condition when said second internal memory means is addressed by said address signal.

20. A semiconductor integrated circuit system as in claim 19, wherein said first internal memory means comprises a random access memory and second internal memory means comprises a read only memory.

21. A semiconductor integrated circuit system as in claim 20, wherein said external memory means comprises an electrically programmable read only memory.

22. A semiconductor integrated circuit device having internal memory means and being operative for replacing said internal memory means by an external memory means, wherein said external memory means is operative selectively in active and inactive operating states, said device comprising:

first and second memories forming said internal memory means, an input control terminal, an input address terminal for receiving a memory address signal, and control circuitry;

said control circuitry including means responsive to
(1) a first state of a control signal applied to said input control terminal for accessing said first and second memories, selectively, depending on said memory address signal, while maintaining said external memory means in the inactive operating state, and
(2) a second state of the control signal applied to said input control terminal for accessing said first memory while maintaining said external memory means in the inactive operating state when said first memory is addressed by said memory address signal and for accessing said external memory means while maintaining said external memory means in the active operating state when said second memory is addressed by said memory address signal.

23. A semiconductor integrated circuit system as in claim 22, wherein said first memory comprises a random access memory and second memory comprises a read only memory.

24. A semiconductor integrated circuit system as in claim 23, wherein said external memory means comprises an electrically programmable read only memory.

25. A method of operating a system comprising a first semiconductor integrated memory circuit which includes first and second internal memories, and a second semiconductor integrated memory circuit, the method comprising the steps of:

inputting a first state of a control signal to said first semiconductor integrated memory circuit;

inputting a memory address signal to said first semiconductor integrated memory circuit;

in response to said first state of the control signal accessing said first and second internal memories, selectively, depending on said memory address signal, while maintaining said second semiconductor integrated memory circuit in an inactive operating state;

applying a second state of the control signal to said first semiconductor integrated memory circuit; and in response to said second state of the control signal accessing said first internal memory while maintaining said second semiconductor integrated memory circuit in the inactive operating state when said first internal memory is addressed by said memory address signal and accessing said second semiconductor integrated memory circuit while maintaining said second semiconductor integrated memory circuit in an active operating state when said second memory is addressed by said memory address signal.

* * * * *